(12) United States Patent
Hu et al.

(10) Patent No.: US 9,716,500 B2
(45) Date of Patent: Jul. 25, 2017

(54) TRANSISTOR SWITCH WITH BACK-GATE BIASING

(71) Applicant: TEXAS INSTRUMENTS INCORPORATED, Dallas, TX (US)

(72) Inventors: Yaqi Hu, Plano, TX (US); Yanli Fan, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/819,077

(22) Filed: Aug. 5, 2015

(65) Prior Publication Data
US 2016/0043722 A1    Feb. 11, 2016

Related U.S. Application Data

(60) Provisional application No. 62/035,168, filed on Aug. 8, 2014.

(51) Int. Cl.
*H03K 19/018* (2006.01)
*H03K 19/0185* (2006.01)

(52) U.S. Cl.
CPC ............................ *H03K 19/018507* (2013.01)

(58) Field of Classification Search
CPC .... H03K 17/122; H03K 17/13; H03K 17/133; H03K 17/145; H03K 17/166; H03K 17/167; H03K 17/223; H03K 17/284; H03K 17/687

USPC ................. 327/108, 109, 110, 111, 112, 427
See application file for complete search history.

(56) References Cited

U.S. PATENT DOCUMENTS

| | | | | |
|---|---|---|---|---|
| 7,095,266 B2 * | 8/2006 | Miske | .................. | H03K 17/162 327/427 |
| 2007/0146953 A1 * | 6/2007 | Ono | .................... | H01L 27/0255 361/100 |
| 2013/0159785 A1 * | 6/2013 | Hashimoto | ........... | G06F 11/004 714/47.2 |

* cited by examiner

*Primary Examiner* — John Poos
(74) *Attorney, Agent, or Firm* — Goutham Kondapalli; Charles A. Brill; Frank D. Cimino

(57) ABSTRACT

Driving a back-gate of a transistor with a follower signal that corresponds to an information signal. At least some of the illustrative embodiments are methods including: passing an information signal from a drain terminal to a source terminal of a main field effect transistor (FET), the information signal has a peak-to-peak voltage; generating a follower signal that corresponds to the information signal, the follower signal electrically isolated from the information signal, and the follower signal has a peak-to-peak voltage lower than the peak-to-peak voltage of the information signal; and applying the follower signal to a back-gate of the main FET.

20 Claims, 5 Drawing Sheets

TRANSISTOR SWITCH WITH BACK-GATE BIASING

CROSS-REFERENCE TO RELATED APPLICATIONS

The present application claims priority to U.S. Provisional Patent Application No. 62/035,168, filed Aug. 8, 2014, titled "USB2 FET Switch With Dynamic Back-Gate Biasing," which is hereby incorporated herein by reference in its entirety.

BACKGROUND

With the advent of new technologies and different communication protocols used in computing systems, circuits need to reliably operate over a broad spectrum of data rates as well as signal levels. For example, in the realm of computer systems, a connection port may be used to couple several devices that use different communication protocols that use different data rates and signal levels. In these situations, the circuitry coupled to the connection port need to reliably operate with the various devices that may be coupled to the connection port. Thus, any advancement that allows this circuitry to operate over a wide range of data rates and signal levels may be beneficial.

BRIEF DESCRIPTION OF THE DRAWINGS

For a detailed description of various examples, reference will now be made to the accompanying drawings in which.

DEFINITIONS

Figure 1:
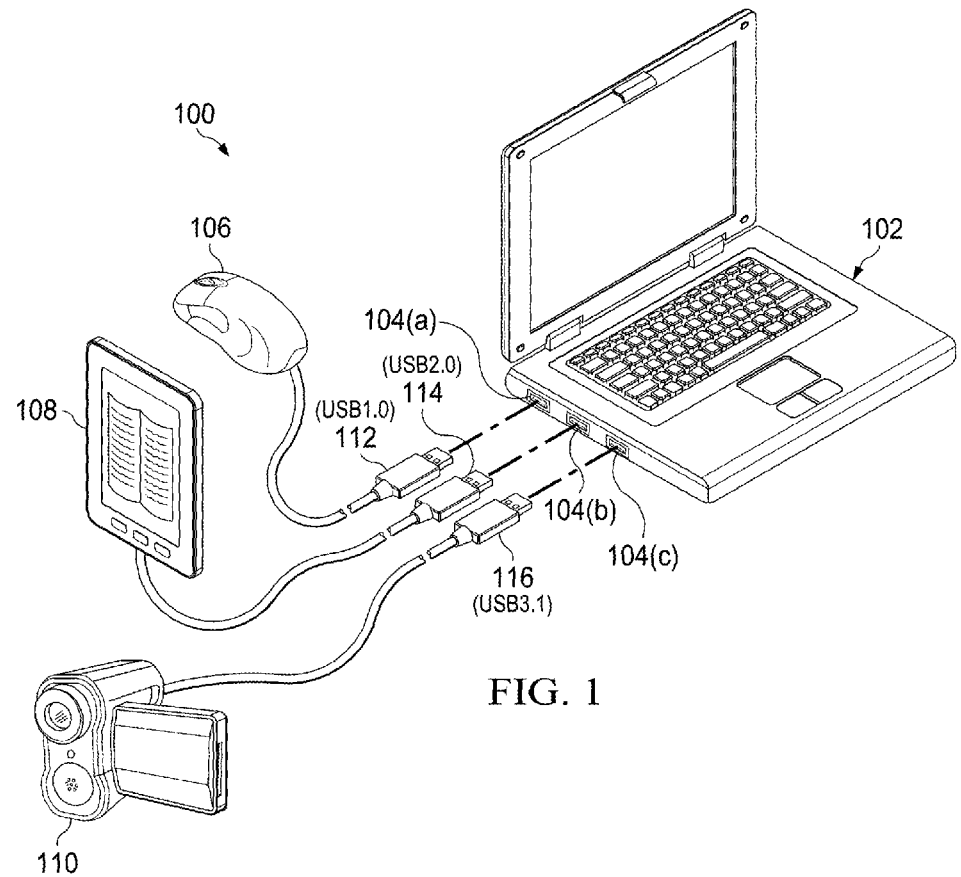
FIG. 1 shows a computing environment utilizing various communication technologies in accordance with at least some embodiments.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections.

Having a first signal "correspond to" a second signal shall mean the second signal has a time-varying signal that matches the first signal in form and frequency, but not necessarily in amplitude and phase.

"Back-gate" shall mean the lead or terminal that couples to the body of a field effect transistor (FET), and may alternatively be referred to as the body terminal, base terminal, bulk terminal, or substrate terminal.

"Body" shall mean the bulk of the semiconductor in which the gate, source, and drain, lie. Body is synonymous with base, bulk, or substrate.

The terminals of a transistor shall be referred to as the gate, source, and drain; however, the terminology shall not be read to imply or require any particular type of transistor.

"Active mode," in relation to a transistor, shall mean that the gate is driven such that the current flow from the drain to the source occurs substantially within the linear region of operation of the transistor. Operating a transistor solely in the saturation region, or swinging alternately between saturation and cut-off shall not be considered operation within the active mode.

A circuit having "a first mode of operation" and a "second mode of operation" shall mean that the circuit has the ability to operate in either mode; however, having multiple modes of operation shall not be read to require the modes are simultaneously present.

"Peak-to-peak voltage" shall mean the magnitude of the difference between the highest and lowest voltage levels of a signal (including a zero or ground voltage). However, the terminology "peak-to-peak voltage" shall not be read to imply or require an alternating current (AC), direct current (DC), or variable DC voltage.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various embodiments are directed to implementing a switch within a Universal Serial Bus (hereafter "USB") port or any other type of port that is capable of operating over wide ranges of data rates and signal levels. In particular, the switch may be coupled to a control circuit that enables the switch to react quickly to an input level change, and also ensures the switch remains stable in situations where data rates and signal levels range widely. The control circuit also helps to reduce jitters caused by pattern dependence and reduces undesirable effects, such as latch-up, caused in some situations when the back-gate to source or back-gate to drain junctions are forward biased. The control circuit also improves off isolation, that is, the switch operates in the cut-off region when the switch is not selected.

FIG. 1 shows an environment 100 in which a host, such as laptop 102 utilizes USB technology to enable a user to connect an electronic device to the laptop 102. USB technology encompasses an industry standard that defines cables, connectors, and communication protocols used in a bus for short-distance digital data communications. According to USB topology, USB peripheral devices are connected with a USB host through a chain of hubs. Although environment 100 depicts a laptop 102 as the host, a host device may include other computing systems such as a desktop computer, a gaming system, a television, or any other device that may serve as a host for USB devices or peripherals using USB technology.

As shown, the laptop 102 has three USB ports 104(a), 104(b), and 104(c). The USB ports 104(a-c) may be used to connect various electronic USB devices to laptop 102. A USB device utilizes the USB standard as a communication protocol, as well as USB cables to communicate with the host. Embodiments of USB devices include a mouse, keyboard, digital camera, digital video recorder, earphones, microphones, printers, digital readers, audio players, speakers, game controllers, scanners, and any other devices that utilize USB technology to connect to laptop 102.

In one example, a user may utilize any of the three USB ports 104(a-c) to connect a mouse 106, a digital reader 108, and a digital video recorder 110 to laptop 102. As depicted, the USB ports 104(a-c) comprise a USB cable connection interface that is compatible with a USB cable. The USB ports 104(a-c) may be coupled to USB cables using different versions of the USB standard (e.g., USB 1.0, USB 2.0, USB 3.0, USB 3.1, etc.).

In various embodiments, the devices 106, 108, and 110 may utilize different versions of the USB standard (i.e., USB 1.0, USB 2.0, USB 3.0, and USB 3.1). The various versions of the USB standard implement different data rates and input levels. For example, USB 1.0 utilizes a slower data transfer rate than USB 2.0, USB 3.0, and USB 3.1. As depicted, mouse 106 represents a device utilizing USB 1.0 and a cable 112 that is compatible with USB 1.0. Digital reader 108 which may benefit from a faster data transfer rate utilizes USB 2.0 and a cable 114 that is compatible with USB 2.0. Digital video recorder 110 utilizes USB 3.1 technology and a cable 116 configured for USB 3.0.

As the USB ports 104(a-c) can be coupled to USB cables using any USB standard, in environment 100, cable 112 may be connected to any of the three USB ports 104(a-c). Likewise, cables 114 and 116 may also be connected to any of the three USB ports 104(a-c). Accordingly, the circuitry that is coupled to the USB ports 104(a-c) may pass information signals varying within a wide range of signals and data rates. Thus, the circuitry may benefit from being able to reliably function within the different versions of the USB standards where information signals may be transferred at different data rates and with different levels. In various embodiments, laptop 102 may communicate with the USB device 106, 108, or 110 to determine the proper version of the USB standard to use once a USB device is physically plugged in.

Figure 2:
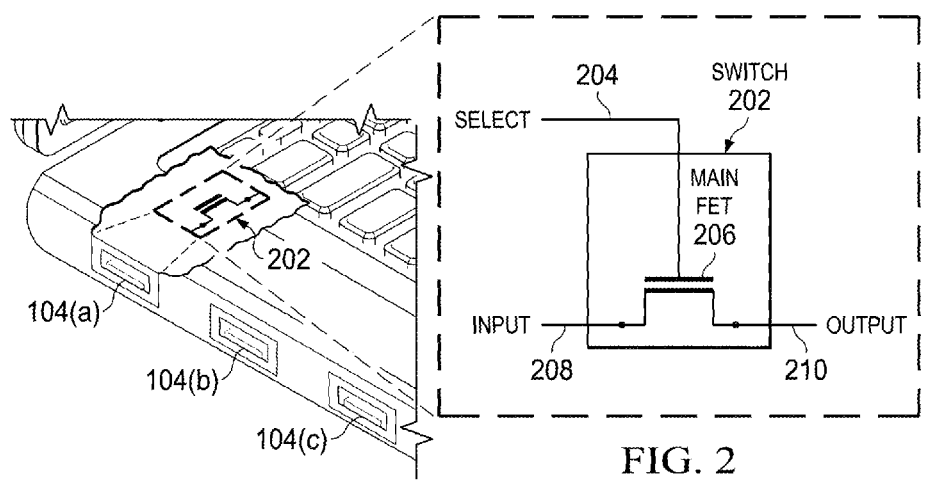
FIG. 2 shows, in partial block diagram form, a switch located within the computing environment in accordance with various examples.

Turning now to FIG. 2, in block diagram form, switch 202 is shown as coupled to USB port 104(a). In particular, in accordance with at least some embodiments, switch 202 may comprise at least one main field effect transistor (FET) 206 capable of receiving an information signal at input port 208 and passing the information signal along to output port 210. Although one switch 202 is depicted as coupled to USB port 104(a), this depiction is not inclusive of all the components coupled to USB port 104(a). For example, USB port 104(a) may be coupled to additional switches similar to switch 202. For discussion purposes, components and features associated with switch 202 will be discussed, however, these components and features discussed with regard to switch 202 may also be present on other switches coupled to USB port 104(a). Additionally, although switch 202 is shown as coupled to USB port 104(a), similar switches are also coupled to USB ports 104(b) and 104(c).

As depicted in FIG. 2, switch 202 is capable of transferring an information signal present at input port 208 when a signal is asserted on the select line 204. When a signal is not asserted on the select line 204, the switch 202 operates in an "off" mode and thus any signal present at input port 208 will not be transferred to the output port 210. In various embodiments, a signal may be asserted on the select line 204 by a system application. In certain embodiments, the select signal is from digital logic which decodes the configuration signals from either a general purpose input/output (I/O) pin or an inter-integrated circuit ($I^2C$) interface.

When a USB device, such as mouse 106 is plugged into the USB port 104(a), information signals may be transferred through switch 202 related to signals sent between mouse 106 and laptop 102. As discussed previously, the information signals originating from a USB 1.0 device, such as mouse 106 will be different from information signals originating from a USB 3.1 device such as digital video recorder 110. Thus the switch 202 benefits from being able to operate within a wide data rate range, a wide signal level range and within multiple detection modes.

Figure 3A:
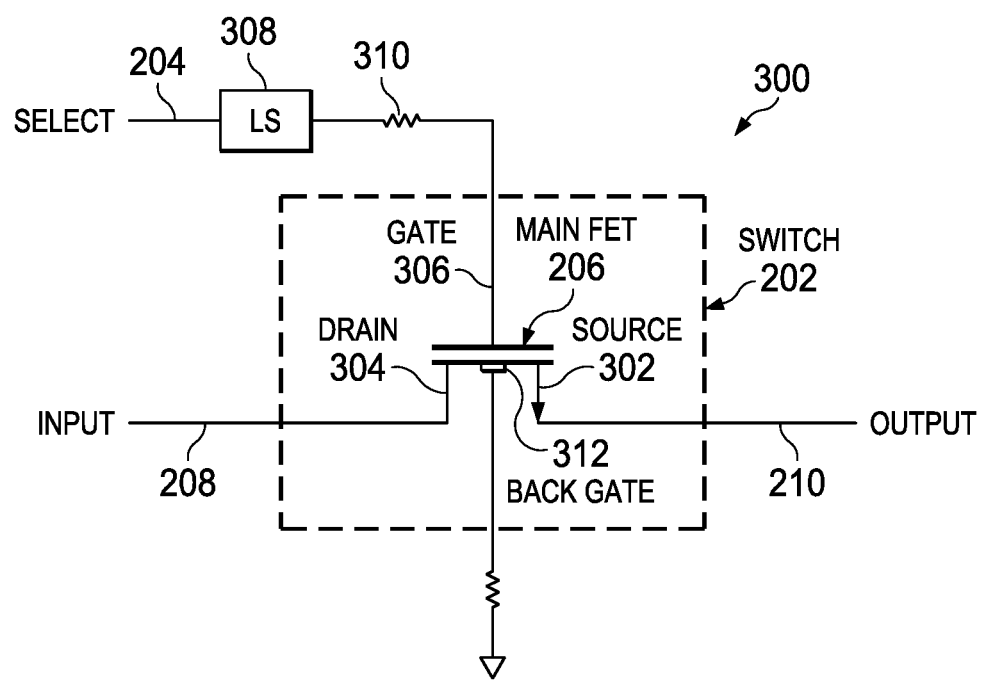
FIG. 3a shows additional features related to a switch located within the computing environment in accordance with various examples.

Turning now to FIG. 3a, circuit diagram 300 is depicted to discuss phenomena that may adversely affect the ability of the switch to operate reliably across a wide range of data rates and signal levels. As discussed previously, switch 202 comprises a main FET 206. Various intrinsic properties associated with the manner in which the main FET 206 is manufactured as well as phenomena that occur while a main FET 206 is operating may introduce conditions that hinder the ability of a switch to operate reliably across a wide range of data rates as well as signal levels. These properties and phenomena will now be discussed.

Main FET 206 comprises at least three terminals, source 302, a drain 304, and a gate 306. In various embodiments, the drain 304 may receive the information signal applied at input port 208 and the main FET 206 may transmit the information signal through the switch and through source 302 to the output port 210 when main FET 206 is on. In various embodiments, main FET 206 is turned on when a signal is asserted at select line 204. The signal at select line 204 may pass through the level shifter 308, through resistor 310 to gate 306. In various embodiments, level shifter 308 may be used to account for various signals that may be asserted at the select line 204. Level shifter 308 may shift the level of the signal asserted at the select line 204 such that the signal is compatible with main FET 206. Thus, a signal asserted at the select line 204 results in the application of a voltage at gate 306.

The capabilities of the source 302 and drain 304 to transmit information signal applied at the drain 304 depends on the voltage that is applied at the gate 306 and a voltage applied at source 302. Initially, the application of a voltage larger than a gate threshold voltage turns on main FET 206. As the voltage applied at gate 306 continues to increase, the main FET 206 may transmit a portion of the information signal applied at drain 304. Eventually, an increase in the voltage applied at gate 306 will not result in an increase in the amount of the information signal that is transmitted by main FET 206. However, a greater voltage applied at drain 304 may continue to increase the amount of the information signal that is transmitted by main FET 206. While the main FET 206 operates in this manner, it is operating in the active mode. In the active region, the relationship between an increase in applied voltage and an increase in the amount of the information signal that is transmitted is linear. While operating in the active region, the main FET 206 acts like a resistor and may be considered to be partially on. The resistance of the main FET 206 while operating in the active mode may be referred to as the on-resistance. The on-resistance is inversely proportional to the over-drive voltage, which is the gate 306 to drain 304 voltage minus the threshold voltage.

Eventually, the main FET 206 will be turned on to a point of saturation, after which an increase in the voltage applied at drain 304 will not result in an increase in the amount of the information signal that is transmitted by main FET 206. While the main FET 206 operates in this manner, it is operating in a saturation mode. When main FET 206 is operating in saturation mode, the entirety of the information signal applied at the drain 304 is transmitted to source 302 and in turn the output port 210. Thus, depending on the amount of voltage applied at gate 306, and the source 302 or drain 304, no signal may be transmitted or a portion or the entirety of the information signal applied at the drain 304 may be transmitted to the source 302 and in turn the output port 210.

The threshold voltage used to pass an information signal from the drain 304 to the source 302 is defined by the size and material of the main FET 206. As discussed previously, the voltage that is applied at gate 306 controls whether the main FET 206 is turned off, and partially controls whether the main FET 206 operates in an active or saturation mode. Thus the voltage applied at gate 306 controls how much of an information signal applied at drain 304 may pass through the main FET 206.

As depicted in FIG. 3a, main FET 206 also has an additional terminal that is depicted as back-gate 312. In various embodiments, back-gate 312 represents a terminal that couples to the body of the main FET 206. Properties of the body and various phenomena occurring in the body during the operation of the main FET 206 may lead to undesirable results. For example, in various embodiments, charge may build up in the body and contribute to the information signal that is transferred between the source 302 drain 304 and the source 302. In various embodiments, charge that is built up in the body may cause issues if the body voltage has been raised high enough so as cause charge to flow to the source 302 and drain 304 from the body.

Additionally, main FET 206 may also experience a body effect that causes changes in the threshold voltage value used to transition the main FET 206 from an off state to an active mode of operation or a saturation mode of operation. In accordance with some embodiments, charge may build up in the body that changes the voltage potential between the body of the main FET 206 and the source 302. The charge build up between the body of the main FET 206 and the source 302 may influence the threshold voltage that is used to transition the main FET 206 from an off state to an active mode of operation or a saturation mode of operation. That is, the body effect may increase or decrease the voltage used at gate 306 to transition the main FET 206 out of an off state. For example, an accumulation of charge in the body may decrease the threshold voltage needed at gate 306. This in turn would result in a lower voltage needed at the gate 306 to transition the main FET 206 to an active mode of operation, which in turn may result in a lower on-resistance of the main FET 206.

In various embodiments, changing the threshold voltage needed to turn the main FET 206 on may cause reliability problems. For example, charge build up between the body and the source 302 may render the level shifter 308 unable to turn on, or fully turn on, the main FET. In other embodiments, due to the body effect, the main FET 206 may not be able to be reliably turned off. In various embodiments of the present disclosure, discussed with respect to FIG. 4, the impact the body effect may have on the gate threshold voltage is controlled.

Figure 3B:
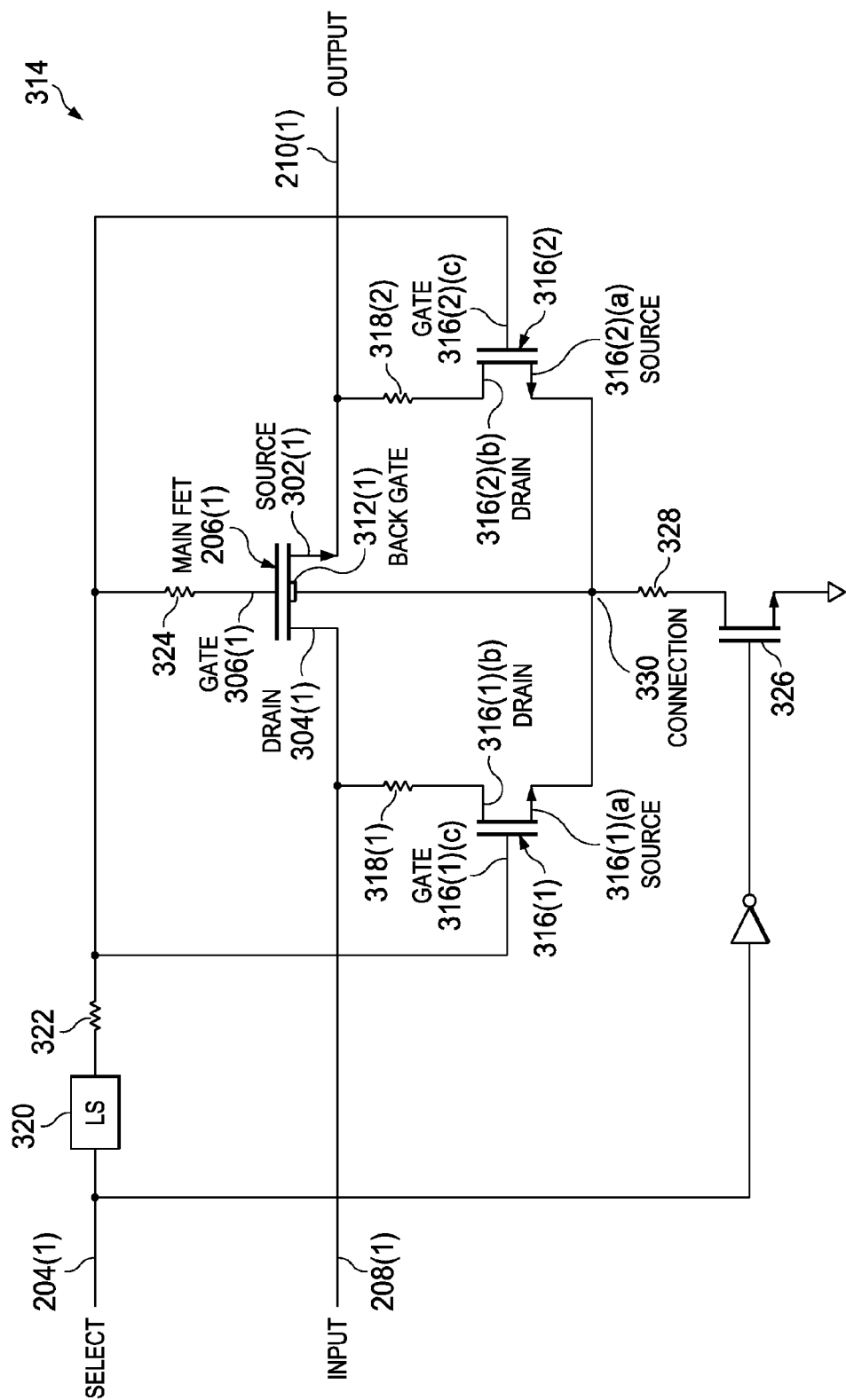
FIG. 3b shows additional features related to a switch located within the computing environment in accordance with various examples.

Turning now to FIG. 3b, and circuit diagram 314, one possible implementation to addressing reliability issues caused by the body effect is depicted. In diagram 314, main FET 206(1) is depicted with a source terminal 302(1) coupled to an input port 208(1), and a drain terminal 304(1) coupled to an output port 210(1). For discussion purposes, components which overlap between circuit diagrams 300 and 314 have been labeled similarly. However, to eliminate confusion, a (1) is used to differentiate between similar components between circuit diagrams 300 and 314. Thus main FET 206 in diagram 300 and main FET 206(1) in diagrams 300 and 314 respectively are similar; however, since FETs 206 and 206(1) are depicted in different diagrams, they have been differentiated accordingly. In various embodiments, main FET 206 may be the same as main FET 206(1) and vice versa. Thus, previous discussions with regards to main FET 206 also apply to main FET 206(1).

Continuing the discussion of shortcomings regarding diagram 314, transistors 316(1) and 316(2) may be coupled to main FET 206(1). Transistors 316(1) and 316(2) are also coupled to input port 208(1) and output port 210(1) respectively, for the purpose of driving the connection 330 (coupled to the back gate 312(1) of the main FET 206(1)) such that a driving signal at connection 330 corresponds to an information signal at input port 208(1) and the information signal at the output port 210(1). The voltage level at the back-gate 312(1) is equivalent to the voltage level of the body of the main FET 206(1). Theoretically, descriptions such as the voltage level at the back-gate 312(1) and the voltage level of the body of the main FET 206(1) may be used interchangeably.

By tying the bulk or connection 330 (coupled to the body of the main FET 206(1)) to the input and output signals, undesirable impacts of the body effect may be partially minimized. However, circuit 314 introduces other issues that affect operation.

Still referring to circuit diagram 314, when a signal is asserted at the select line 204(1), the signal may be adjusted by level shifter 320, before the signal travels through resistors 322 and 324 and is applied at gate 306(1). When a signal exceeding the gate threshold voltage is applied at gate 306(1), the main FET 206(1) is transitioned out of an off mode and information signals received at input port 208(1) may be transmitted through the main FET 206(1) to the output port 210(1).

Additionally, when the signal is asserted at the select line 204(1), transistors 316(1) and 318(1) will also be transitioned from an off mode to an on mode. As depicted in circuit diagram 314, drain terminal 316(1)(b) of transistor 316(1) is coupled to the input port 208(1). In turn, the source terminal 316(1)(a) of transistor 316(1) is coupled to the connection 330 coupled to the body of the main FET 206(1). Similarly, drain terminal 316(2)(b) of transistor 316(2) is coupled to the output port 210(1) and source terminal 316(2)(a) of transistor 316(2) is coupled to the connection 330 coupled to the body of the main FET 206(1). In various embodiments, when a signal is asserted at the select line 204(1), a voltage is applied to the respective gates of transistors 316(1) and 316(2). The signal asserted exceeds the gate threshold voltages for transistors 316(1) and 316(2);

accordingly, a signal asserted at the select line 204(1) transitions transistors 316(1) and 316(2) out of off modes.

With transistors 318(1) and 318(2) operating in either an active mode or saturation mode, the connection 330 is electrically coupled to the information signal that is received at input port 208(1) and output through the output port 210(1). The electrical coupling occurs because when transistors 316(1) and 316(2) are in an active or saturation mode, a portion of the signal at the input port 208(1) and output port 210(1) are transmitted through transistors 316(1) and 316(2) and applied to body 330. A portion of the information signals at the input port 208(1) and output port 210(1) are passed through the transistors 316(1) and 316(2), due to the fact that these information signals must pass through resistors 318(1) and 318(2).

However, due to a large capacitive effect between the body of the main FET 206(1), and source 302(1) and drain 304(1), large resistors are used between the terminals. Due to the large capacitive effects, the body of the main FET 206(1) may be inadvertently charged higher than the source 302(1) or the drain 304(1). This results in a forward bias of the back-gate to source and back-gate to drain junctions. A forward-bias at these junctions may cause undesirable effects such as latch-up. Additionally, without resistors 318(1) and 318(2), a large body capacitance may not be sufficiently isolated from the source and drain of main FET 206(1), which may cause signals to slow down. In order to be effective, resistors 318(1) and 318(2) have very large values, such as in the order of hundreds of kilohms. If resistors 318(1) and 318(2) are not placed between the connection 330 and the source 302(1) and drain 304(1), the input port 208(1) and output port 210(1) may be impacted by the body of the main FET 206(1). Having the body of the main FET 206(1) impact the input port 208(1) and the output port 210(1) may cause undesired effects, where the body effect experienced by the main FET 206(1) impacts the signals that are transmitted through the main FET 206(1).

Moreover, in some situations the body of the main FET 206(1) may inject current into the input port 208(1), which may also cause undesirable effects. For example, in one situation the body of the main FET 206(1) may be charged and the input port 208(1) may be in a floating state. In such a scenario, without the resistor 318(1) in place, the body of the main FET 206(1) may inject current into the input port 208(1) which may cause false signals to pass through the main FET 206(1). In this scenario the signals are not real signals being sent by a USB device, such as mouse 106.

However, the need to place large resistors between the input port 208(1) and the output port 210(1), and the body of the main FET 206(1), results in the body of the main FET 206(1) being slow to react to the information signals transmitted from the input port 208(1) to the output port 210(1) as well as pattern dependence by the main FET 206(1) which may lead to jitter. The body of the main FET 206(1) reacting slowly to information signals present at line 208(1) and output port 210(1), may distort information signals which may result in continued reliability issues.

Figure 4:
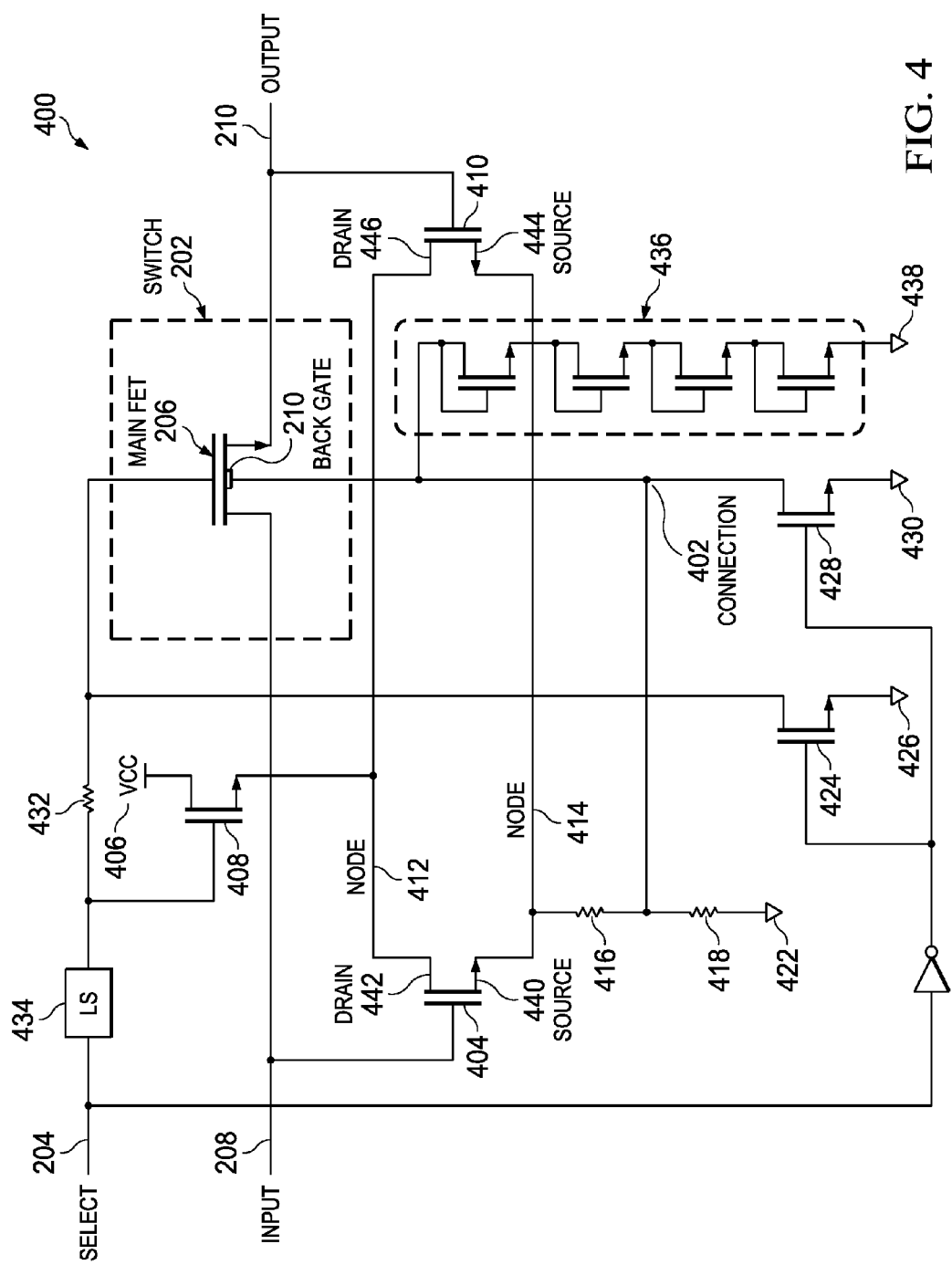
FIG. 4 shows a circuit diagram of a control circuit coupled to the switch located within the computing environment.

FIG. 4 shows a circuit diagram 400 in accordance with various embodiments that address at least some of the shortcomings described with respect to the circuits of FIG. 3. In addition, the circuit diagram 400 utilizes the body effect in a manner such that an on-resistance is minimized and junctions of the main FET 206 between the source and body and drain and body are maintained in a reverse-biased state during operation of the main FET 206. In particular, FIG. 4 depicts a switch 202 which is coupled to a control circuit comprising active components. The control circuit ties the back gate 210 of the main FET 206 closely to information signals received at input port 208 and output port 210 while also ensuring the body of the main FET 206 is properly isolated from the information signals transmitted through input port 208 and output port 210. In various embodiments, by tying the back gate 210 of the main FET 206 closely to information signal received at input port 208 and output port 210, an on-resistance of the main FET 206 is minimized.

In FIG. 4, main FET 206 is coupled to input port 208 and output port 210. As discussed previously, the source of the main FET 206 is coupled to the input port 208 and the drain of the main FET 206 is coupled to the output port 210. The back-gate 210 of the main FET 206 is also coupled to the control circuit, depicted by the connection, connection 402. As the back-gate 210 is coupled to the connection 402, the body of the main FET 216 is coupled to the connection 402. When a signal is asserted on select line 204, the main FET 206 transitions out of an off mode and begins operating in a saturation mode and information signals received at input port 208 will be transferred to the output port 210.

As depicted in circuit diagram 400, the input port 208 and output port 210 are also coupled to the connection 402. A coupling between the input port 208 and output port 210, and connection 402, allows the connection 402 and thus the body of the main FET 206 to react quickly to information signals passed through the main FET 206. When the body of the main FET 206 reacts quick to information signals passed through the main FET 206, an on-resistance of the main FET 206 is reduced. Additionally, by tying the body of the main FET 206 to the information signals passed through the main FET 206, the circuit may maintain the junction between the body and source of the main FET 206 and the junction between body and drain of the main FET 206 in a reverse-biased state during fast downward signal transitions. The connection 402 is coupled to the input port 208 through a transistor 404. The gate of transistor 404 is coupled to the input port 208. Thus when an information signal is asserted at the input port 208, transistor 404 is transitioned out of an off mode.

In various embodiments, transistor 404 operates in the active mode when turned on by an information signal at the input port 208. As discussed previously, in the active mode, the amount of signal that is transferred by the transistor 404 relates linearly to the amount of voltage applied at the drain 442 of transistor 404. Additionally, in the active mode, the entirety of the signal present at the drain 442 may not be transferred to the source 440. Thus, the signal present at the source 440 is a portion of the signal that is present at drain 442. As depicted, drain 442 is coupled to a power source 406. Power source 406 may be any device or component that provides power and may include power rails, voltage sources, current sources, etc.

When a signal is asserted on select line 204, the signal may be adjusted by level shifter 434 and applied at the gate of field effect transistor 408. In turn, transistor 408 is turned on and the signal from power source 406 will be transferred to the drain 442 of transistor 404. Because the transistor 404 is operating in an active mode, a portion of the signal from power source 406 will be transferred through transistor 404 instead of the entire signal. Thus, the voltage level at node 412 will be higher than the voltage level at node 414. In this manner, the transistor 404 creates a follower signal that is applied to connection 402. The follower signal depends largely on the information signal present at input port 208; the dependence is due to the fact that transistor 404 is operating in the active mode. A larger signal at the input port 208 will result in a larger follower signal.

In various embodiments, a follower signal may be generated through transistor 410, in response to an information signal at output port 210 and the control circuit may drive the connection 402 with this follower signal. Field effect transistor 410 is operated in a manner similar to transistor 404; however, drain 446 of transistor 410 is connected to the output port 210. Thus the information signal present at the output port 210 controls the amount of signal that is passed through transistor 410 to create a follower signal at source 444 on node 414. In various embodiments, the follower signals created by both transistors 404 and 410 may be combined to create the follower signal that is applied to connection 402 coupled to the back gate 210 of the main FET 206 (and thus coupled to the body of the main FET 206).

The follower signal at node 414 may be applied to connection 402 and thus the body of the main FET 206, through a voltage divider created by resistors 416 and 418. Through the voltage divider created by resistors 416 and 418, the follower signal is additionally reduced prior to being applied to connection 402. In various embodiments, resistors 416 and 418 may be smaller than the resistors 318(1) and 318(2) discussed in circuit diagram 314 depicted in FIG. 3b. For example, resistors 416 and 418 may have a value in the order of one kilohm. That is, the resistors 416 and 418 may have a value between 0 and 10 kilohms.

Resistors 416 and 418 may have a smaller value than resistors 318(1) and 318(2) due to the fact that resistors 416 and 418 are not the only components that serve to isolate the connection 402 and thus the body of the main FET 206 from the information signal at input port 208. For example, transistor 404, which is coupled between the connection 402 and the input port 208 serves to drive a voltage of the connection 402. The particular circuit interconnections prevent the connection 402 and thus the body of the main FET 206 from impacting the signals at input port 208 and output port 210. In other words, by generating a follower signal through transistor 404, in response to an information signal at input port 208, and driving the connection 402 and thus the body of the main FET 206 with the follower signal, the control circuit ensures that the connection 402 remains at a level that follows the information signal at input port 208, and through the use of resistors 416 and 418, the follower signal is also maintained at a level that is below the level of the information signal.

Maintaining a voltage level of the body of the main FET 206 below the level of the information signal will prevent the back-gate to source junction and the back-gate to drain junctions from being forward-biased. The isolation prevents the connection 402 and thus the body of the main FET 206 from generating false signals, or otherwise unintentionally altering the information signal, which in turn may cause reliability issues such as latch-up or jitter. Additionally, by maintaining a connection 402 and thus the body of the main FET 206 at levels that correspond to the information signal at input port 208, the on-resistance of the main FET 206 is minimized as well.

As discussed above, resistor 416 and resister 418, create a voltage divider coupling the connection 402 to the input port 208. Additionally the use of smaller resisters 416 and 418, in comparison to resistors 318(1) and 318(2) is possible because a proper amount of isolation is present between connection 402 and the information signal at input port 208. The resistors 416 and 418 may have smaller values in order to drive the connection 402 quickly while not adding loads to the information signal at input port 208 or output port 210. That is, the use of smaller resistors 416 and 418 results in smaller delays occurring in the time it takes for the connection 402 and thus the body of the main FET 206 to react to the information signal at input port 208.

In various embodiments, if an information signal is not present at input port 208 or output port 210, but if a select signal is asserted at select line 204, connection 402 and thus the body of the main FET 206 remains at the level the connection 402 was at prior to an information signal no longer being present at input port 208 or output port 210. The terminals of the main FET 206 maintain voltage levels that were present prior to an information signal no longer being present at input port 208 or output port 210 because no current is flowing to input port 208 or output port 210.

In accordance with various embodiments, when a signal is not asserted at the select line 204, field effect transistors 424 and 428 are turned on. In turn the gate of the main FET 206 and the back-gate 210 of the main FET 206 are coupled to grounds 426 and 430, respectively. Grounding the gate and the back-gate of the main FET 206 ensures that main FET 206 is operating in the cut-off region and therefore is off, when a signal is not asserted on the select line 204. In several embodiments of the control circuit, a series of transistors 436 may also be coupled to connection 402 and thus the body of the main FET 206. The series of transistors 436 is coupled to ground 438. This series of transistors 436 may help discharge excess build up of charge in the connection 402, which may occur during sudden changes in the information signal at input port 208. Although circuit diagram depicts four transistors in the series 436, a fewer or greater number of transistors may be used. Four transistors in the series 436 have been depicted in diagram 400 for illustrative purposes.

Figure 5:
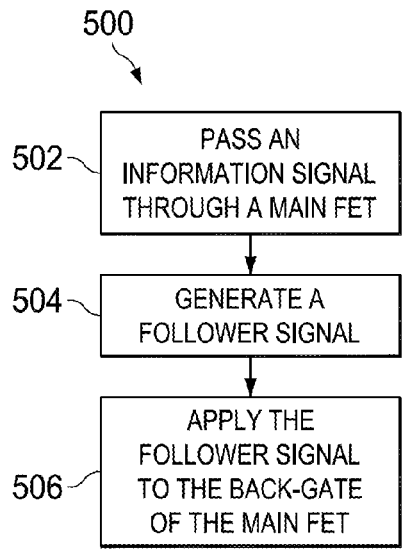
FIG. 5 shows, in block diagram form, a method in accordance with at least some embodiments.

Turning now to FIG. 5, a flow diagram 500 is shown depicting an overall method of using a control circuit to drive the body of a FET. Method 500 may be performed by any suitable circuit components in any suitable circuit design, such as circuit diagram 400, that supports driving the body of the FET in a manner discussed. In various embodiments, some of the blocks shown in FIG. 5 may be performed concurrently, in a different order than shown, or omitted. Additional method elements may be performed as desired.

The method starts at block 502, where an information signal is passed through a main FET. As discussed previously, this information signal may come from a USB device and applied at an input line. At block 504, a follower signal is generated. The follower signal is created by a control circuit that is coupled to the main FET. The control circuit is designed to create a follower signal that corresponds to the information signal at the input line. At block 506, the follower signal is applied to the back-gate of the main FET. The control circuit is designed such that it maintains a follower signal that remains below the level of the information signal. By maintaining the follower signal in this manner, the reliability of the FET is increased.

Figure 6:
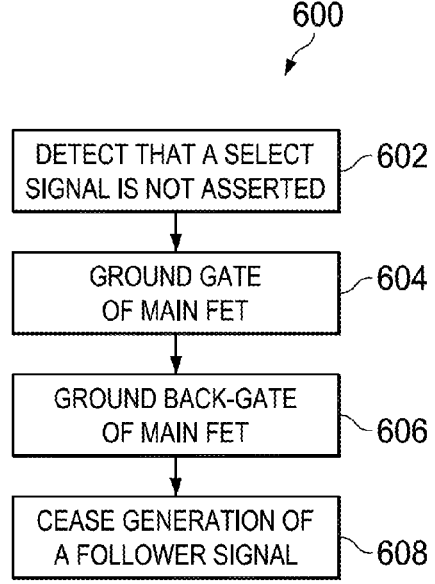
FIG. 6 shows, in block diagram form, an additional method in accordance with at least some embodiments.

Turning now to FIG. 6, a flow diagram 600 is shown depicting an overall method of using a control circuit to maintain a main FET in a guaranteed cutoff mode. The method may be performed by any suitable circuit components in any suitable circuit design, such as circuit diagram 400, that supports maintaining a FET in the manner discussed. In various embodiments, some of the blocks shown in FIG. 6 may be performed concurrently, in a different order than shown, or omitted. Additional method elements may be performed as desired.

At block 602, the control circuit may detect that a signal is not asserted at the select line. In various embodiments, a signal may not be asserted when a USB device ceases to be plugged in to a host. In this case, a main FET used to transfer information signals along the USB connection may need to be turned off. At block 604, the control circuit may ground the gate of the main FET. This may be done by coupling the gate terminal of the main FET to ground. At block 606, the control circuit also grounds the back-gate of the main FET. Similar to the gate, the control circuit may achieve this by coupling the back-gate terminal of the main FET to ground. At block 608, the control circuit may cease generation of a follower signal. In other modes of operation, the follower signal is used to drive the back-gate of the main FET. As the FET is now turned off, generation of the follower signal is no longer required.

Figure 7:
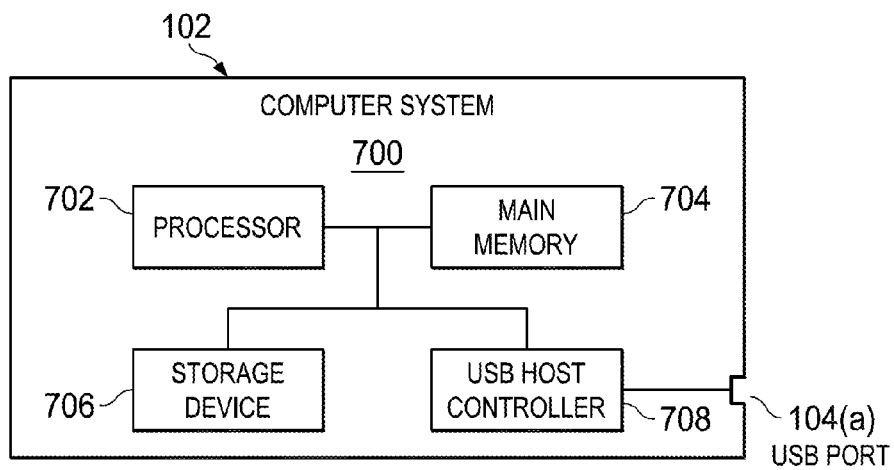
FIG. 7 shows, in block diagram form, a computer system in accordance with at least some embodiments.

FIG. 7 shows a computer system 700 which is illustrative of a computer system within which a USB port comprises various embodiments of the main FET. The computer system 700 may be illustrative of, for example laptop 102. In another embodiment, computer 700 may be illustrative of a computing system such as a desktop computer, television, gaming system, or any other computing system that comprises a USB host controller and a USB port capable of communicating using USB protocols. The computer system 700 comprises a processor 702, main memory 704 coupled to processor 702 and a storage device 706.

Programs executable by the processor 702 may be stored on the storage device 706 (e.g., a hard drive, solid state disk, memory stick, optical disc), and accessed when needed by the processor 702. The program stored on the storage device 706 may comprise programs to implement various processes on the computer system 700. In some cases, the programs are copied from the storage device 706 to the main memory 704, and the programs are executed from the main memory 704. Thus, both the main memory 704 and storage device 706 shall be considered computer-readable storage mediums. Additionally, computer system 700 may comprise a USB host controller 708 coupled to the processor 702 and memory 704. The USB host controller 708, in turn, is coupled to a USB port 104(*a*), and receives signals from a USB device plugged in at USB port 104(*a*).

In various embodiments, the USB port 104(*a*) comprises a main FET and a control circuit coupled to the main FET as discussed in accordance with the descriptions herein. As also discussed previously, in one mode of operations, the control circuit generates a follower signal and applies the follower signal to the back-gate of the main FET. In another mode of operations the control circuit ground the gate and the back-gate of the main FET.

From the description provided herein, those skills in the art are readily able to combine software with appropriate general-purpose or special-purpose computer hardware to create a computer system and/or computer sub-components in accordance with the various embodiments.

References to "one embodiment," "an embodiment," "some embodiments," various embodiments," or the like indicate that a particular element or characteristic is included in at least one embodiment of the invention. Although the phrases may appear in various places, the phrases do not necessarily refer to the same embodiment.

The above discussion is meant to be illustrative of the principles and various embodiments of the present invention. For example, although examples of the switch have been described in the context of USB technology, the disclosed switch may be used in any kind of circuitry where a switch benefits from being able to operate reliably over a wide range of data rates and signal levels. Numerous variations and modifications will become apparent to those skilled in the art once the above disclosure is fully appreciated. It is intended that the following claims be interpreted to embrace all such variations and modifications.

What is claimed is:

1. A method, comprising:
   passing an information signal from a first conducting terminal of a main field effect transistor (FET) to a second conducting terminal of the main FET;
   generating, by a first follower transistor, a follower signal that corresponds to the information signal, the follower signal generated by driving a gate terminal of the first follower transistor with the information signal, the gate terminal of the first follower transistor coupled to the first conducting terminal of the main FET and a drain terminal of the first follower transistor coupled to a power rail; and
   applying the follower signal to a back-gate of the main FET.

2. The method of claim 1, further comprising:
   detecting that a select signal is not asserted, and responsive to the detecting that the select signal is not asserted:
      grounding a gate terminal of the main FET;
      grounding the back-gate of the main FET; and
      ceasing the generation of the follower signal.

3. The method of claim 2, wherein grounding the back-gate further comprises grounding the back-gate through a first transistor.

4. The method of claim 3 further comprising:
   responsive to the detecting that the select signal is not asserted, grounding the gate terminal of the main FET through a second transistor.

5. The method of claim 1, wherein generating the follower signal further comprises:
   operating the first follower transistor in an active region generating the follower signal on a source terminal of the first follower transistor.

6. The method of claim 5, wherein operating the first follower transistor in the active region further comprises driving the gate terminal of the first follower transistor with the information signal by coupling the gate terminal of the first follower transistor to the first conducting terminal of the main FET.

7. The method of claim 5, wherein operating the first follower transistor in the active region further comprises driving the gate terminal of the first follower transistor with the information signal by coupling the gate terminal of the first follower transistor to the second conducting terminal of the main FET.

8. The method of claim 1, wherein generating the follower signal further comprises:
   operating the first follower transistor in an active region by driving the gate terminal of the first follower transistor with the information signal by coupling the gate terminal of the first follower transistor to the first conducting terminal of the main FET;
   operating a second follower transistor in an active region by driving a gate terminal of the second follower transistor with the information signal by coupling the gate terminal of the second follower transistor to the second conducting terminal of the main FET; and
   generating the follower signal as the combination of the signal on source terminals of the first and second follower transistors.

9. The method of claim 1, wherein passing the information signal further comprises conducting signals via a Universal Serial Bus (USB) connection.

10. A system comprising:
a main field effect transistor (FET), wherein a gate terminal of the main FET is coupled to a selection line, a first conducting terminal of the main FET is coupled to an input port and a second conducting terminal of the main FET is coupled to an output port; and
a control circuit coupled to the main FET and the selection line, the control circuit having a first mode of operation that applies a follower signal to a back-gate of the main FET, the follower signal corresponds to an information signal applied to the input port, the follower signal generated by driving a gate terminal of a first follower transistor with the information signal, the gate terminal of the first follower transistor coupled to the first conducting terminal of the main FET and a drain terminal of the first follower transistor coupled to a power rail.

11. The system of claim 10, wherein the control circuit further comprises:
the first follower transistor, a source terminal of the first follower transistor coupled to the back-gate of the main FET; and
wherein in the first mode of operation the first follower transistor is configured to generate the follower signal and apply the follower signal to the back-gate of the main FET.

12. The system of claim 11, wherein the control circuit further comprises:
a second follower transistor, a gate terminal of the second follower transistor coupled to the second conducting terminal of the main FET, a drain terminal of the second follower transistor coupled to the power rail, and a source terminal of the second follower transistor coupled to the back-gate of the main FET; and
wherein in the first mode of operation the second follower transistor is configured to generate the follower signal along with the first follower transistor.

13. The system of claim 11, wherein the control circuit further comprises:
a first grounding transistor, a gate terminal of the first grounding transistor coupled to the selection line, a drain terminal of the first grounding transistor coupled to the back-gate of the main FET, and a source terminal of the first grounding transistor coupled to ground; and
wherein in a second mode of operation the first grounding transistor grounds the back-gate of the main FET.

14. The system of claim 13, wherein the control circuit further comprises:
a second grounding transistor, a gate terminal of the second grounding transistor coupled to the selection line, a drain terminal of the second grounding transistor coupled to the gate terminal of the main FET, and a source terminal of the second grounding transistor coupled to ground; and
wherein in the second mode of operation the second grounding transistor grounds the gate terminal of the main FET.

15. The system of claim 11, wherein the first follower transistor is further configured to operate in an active region in the first mode of operation, and to generate the follower signal on the source terminal of the first follower transistor.

16. The system of claim 11, wherein the control circuit further comprises:
a resistor coupled to the source terminal of the first follower transistor, the resistor additionally coupled to the back-gate of the main FET.

17. The system of claim 10, wherein the control circuit further comprises:
a set of transistors connected in series, wherein the set of transistors are coupled to the back-gate of the main FET; and
wherein the system is configured to discharge an accumulation of charge in a body of the main FET through the set of transistors.

18. A system comprising:
a processor;
a memory coupled to the processor; and
a Universal Serial Bus (USB) port coupled to the processor and memory, wherein the USB port comprises:
a main field effect transistor (FET), wherein a gate terminal of the main FET is coupled to a selection line, a first conducting terminal of the main FET is coupled to an input port and a second conducting terminal of the main FET is coupled to an output port;
a control circuit coupled to the main FET and the selection line, the control circuit having a first mode of operation that applies a follower signal to a back-gate of the main FET, the follower signal corresponds to an information signal applied to the input port, the follower signal generated by driving a gate terminal of a follower transistor with the information signal, the gate terminal of the first follower transistor coupled to the first conducting terminal of the main FET and a drain terminal of the first follower transistor coupled to a power rail.

19. The system of claim 18, wherein the control circuit further comprises:
the follower transistor, a source terminal of the follower transistor coupled to the back-gate of the main FET;
a grounding transistor, a gate terminal of the grounding transistor coupled to the selection line, a drain terminal of the grounding transistor coupled to the back-gate of the main FET, and a source terminal of the grounding transistor coupled to ground;
wherein in a first mode of operation the follower transistor is configured to generate a follower signal and apply the follower signal to the back-gate of the main FET; and
wherein in a second mode of operation, the grounding transistor grounds the back-gate of the main FET.

20. The method of claim 1, wherein the first conducting terminal is a drain terminal and the second conducting terminal is a source terminal.

* * * * *